United States Patent [19]

Yoon

[11] Patent Number: 5,487,028
[45] Date of Patent: Jan. 23, 1996

[54] METHOD FOR ARRANGING COLUMN DECODERS IN A VIDEO RAM

[75] Inventor: Sei S. Yoon, Seoul, Rep. of Korea

[73] Assignee: Samsung Electronics Co., Ltd., Suwon, Rep. of Korea

[21] Appl. No.: 279,171

[22] Filed: Jul. 22, 1994

[30] Foreign Application Priority Data

Jul. 31, 1993 [KR] Rep. of Korea .................. 1993-14845

[51] Int. Cl.⁶ .................................................... G11C 5/02
[52] U.S. Cl. ........................... 365/51; 365/63; 365/230.06
[58] Field of Search ............................ 365/51, 63, 230.06

[56] References Cited

U.S. PATENT DOCUMENTS 5,321,646  6/1994  Tomishima et al. ....................... 365/51
5,349,552  9/1994  Zampaglione ............................. 365/51
5,361,223  11/1994  Inoue et al. ................................ 365/51

Primary Examiner—Do Hyun Yoo
Attorney, Agent, or Firm—Stephen R. Whitt; Allen LeRoy Limberg; Charles R. Donohoe

[57] ABSTRACT

A method of arranging column decoders in a video RAM, including the steps of arranging a memory cell array into a plurality of memory sub-cell arrays, and positioning a column decoder to one side of each memory sub-cell array between the memory sub-cell array and centrally located peripheral circuits including a predecoder. The column decoder includes a RAM column decoder section and a SAM column decoder section.

8 Claims, 6 Drawing Sheets

METHOD FOR ARRANGING COLUMN DECODERS IN A VIDEO RAM

BACKGROUND OF THE INVENTION

The present invention relates to a video RAM and more particularly to a method for arranging RAM column decoders and SAM column decoders within a video RAM.

Video RAMs have become an important and integral part of present computer systems, most notably laptop computers and notebook computers, and consumer electronics. A video RAM is a memory device providing two principal functions. The first function is that of a dynamic random-access-memory (RAM) device. The second function is that of a high speed serial-access-memory (SAM) device. Generally, the RAM and SAM functions can be asynchronously provided through dual access ports, a RAM port and a SAM port. The RAM port is typically connected to a CPU in the computer system. The SAM port is typically connected to the an external system such as a cathode-ray-tube (CRT) or video camera.

In order to provide the widest possible variety of operational capabilities and largest memory capacity, video RAMs have been integrated with increasing density. The two factors which must be addressed in realizing increased integration of video RAMs are data access speed and current consumption. Increased memory density necessarily increases the number of memory cells per unit area. Unavoidably, increased memory cells require an increased number of decoders. However, the increasing number of decoders adversely complicate the layout of the video RAM and impedes efforts to increase integration of the overall device. In particular, the RAM and SAM portions of the video RAM separately require, in their association with the unit memory cell array, independent column decoders. This arrangement will be further explained with reference to FIG. 1.

FIG. 1. illustrates an exemplary conventional arrangement of column decoders in a video RAM. The conventional layout is used, for example, in video RAM products KM424C257 and KM428C128 manufactured by Samsung Electronics Co., Ltd. Referring to FIG. 1, a column address signal derived from an external source is applied to column address input buffer 2. The output of column address input buffer 2, CAi, is applied to RAM column predecoder 4 and SAM counter 6. In turn, SAM counter 6 applies a SAM column address signal, SCAi to SAM column predecoder 8. Signal RDCAij is applied to a plurality of RAM column decoders 12 from RAM column predecoder 4. Similarly, another signal SDCAij is applied to a plurality of SAM column decoders 14 from SAM column predecoder 8. Each RAM column decoder 12 and each SAM column decoder 14 are arranged on either side of a corresponding memory subcell array 10. In the particular example shown in FIG. 1, there are four subcell arrays independently accessed by a corresponding RAM column decoder 12 and a SAM column decoder 14.

In the foregoing arrangement, SAM column predecoder 8 is remotely located from SAM column decoder 14. This arrangement uses chip space inefficiently and impedes efforts to further integrate the video RAM. Additionally, the excessively long signal line(s) between SAM column predecoder 8 and SAM column decoder 14 develop a loading capacitance which adversely affects current drain.

FIG. 2 illustrates in greater detail the layout of, and respective relationships between RAM column decoder 12, SAM column decoder 14, and subcell array 10 of FIG. 1. RAM column decoder 12 and SAM column decoder 14 respectively comprise column decoder portions #0, #1, . . . #i. Each column decoder portion is typically responsive to a portion of the respective predecoder address signals RDCAij and SDCAij. For example, RAM column decoder portion #0 generates a first RAM column select line signal, RCSL0, in response to RDCAij or a portion thereof. RCSL0 switches transistors 22 and 24 according to its binary logic level (high=1, or low=0). RAM input/output lines (RIO and $\overline{RIO}$) are respectively connected to the channel paths of transistors 22 and 24. A similar exemplary relationship exists between SAM column decoder portion #0, first SAM column select line signal, SCSL0, transistors 26 and 28, and SIO and $\overline{SIO}$.

Subcell array 10 comprises RAM cell array 10A connected to RAM column decoder 12, and SAM cell array 10B connected to SAM column decoder 14. Data is read from, or written to RAM cell array 10A through RIO and $\overline{RIO}$. Data is read from, or written to SAM cell array 10B through SIO and $\overline{SIO}$. Since RAM column decoder 12 and SAM column decoder 14 are arranged on opposite sides of subcell array 10, separate power supply lines must be provided to each decoder. This requirement creates an inefficient layout, and causes increased power line noise within the video RAM.

SUMMARY OF THE INVENTION

The present invention provides a method for arranging column decoders in a video RAM which improves layout efficiency. As a result, video RAM chip density can be increased without adversely affecting data access speed. Additionally, the present invention provides a method for arranging column decoders in a video RAM which reduces the distance between a column predecoder and a column decoder, thereby reducing the loading capacitance on signal lines between these two elements. The present invention provides a method for arranging column decoders in a video RAM which also yields common power lines to SAM and RAM decoders. As a result of the foregoing, density of the video RAM can be increased without adversely affecting current consumption and signal noise.

The present invention solves the foregoing problems, and addresses other shortcomings within the prior art by providing, in one aspect, a method for arranging column decoders in a video RAM including the steps of; arranging a memory cell array into a plurality of memory sub-cell arrays, each memory sub-cell array having a plurality of memory cells arranged in columns and rows, and arranging a column decoder to one side of each one of said plurality of sub-cell arrays, the column decoder comprising a RAM column decoder section and a SAM column decoder section.

In another aspect, the present invention comprises a method for arranging column decoders in a video RAM comprising the steps of arranging a memory cell array into a plurality of memory sub-cell arrays, each memory sub-cell array having a plurality of memory cells arranged in columns and rows and divided into a RAM cell array and a SAM cell array, centrally disposing a RAM predecoder and a SAM predecoder between the plurality of memory sub-cell arrays, and arranging a corresponding column decoder to one side of each one of said plurality of sub-cell arrays, the column decoder comprising a RAM column decoder section and a SAM column decoder section.

BRIEF DESCRIPTION OF THE DRAWINGS

The above described benefits and other advantages of the present invention will become more apparent upon consideration of preferred embodiments of the present invention with reference to the attached drawings. In the drawings, like elements are similarly designated with like reference numerals, wherein.

DETAILED DESCRIPTION OF THE INVENTION

The term "column decoder" as used with respect to the present invention means a decoder for directly designating a path through which memory cell data is transferred. Further, the term "column predecoder" means a decoder for indirectly designating a path through which memory cell data is transferred. A column predecoder is typically located between a column address input buffer and the column decoder.

Figure 1:
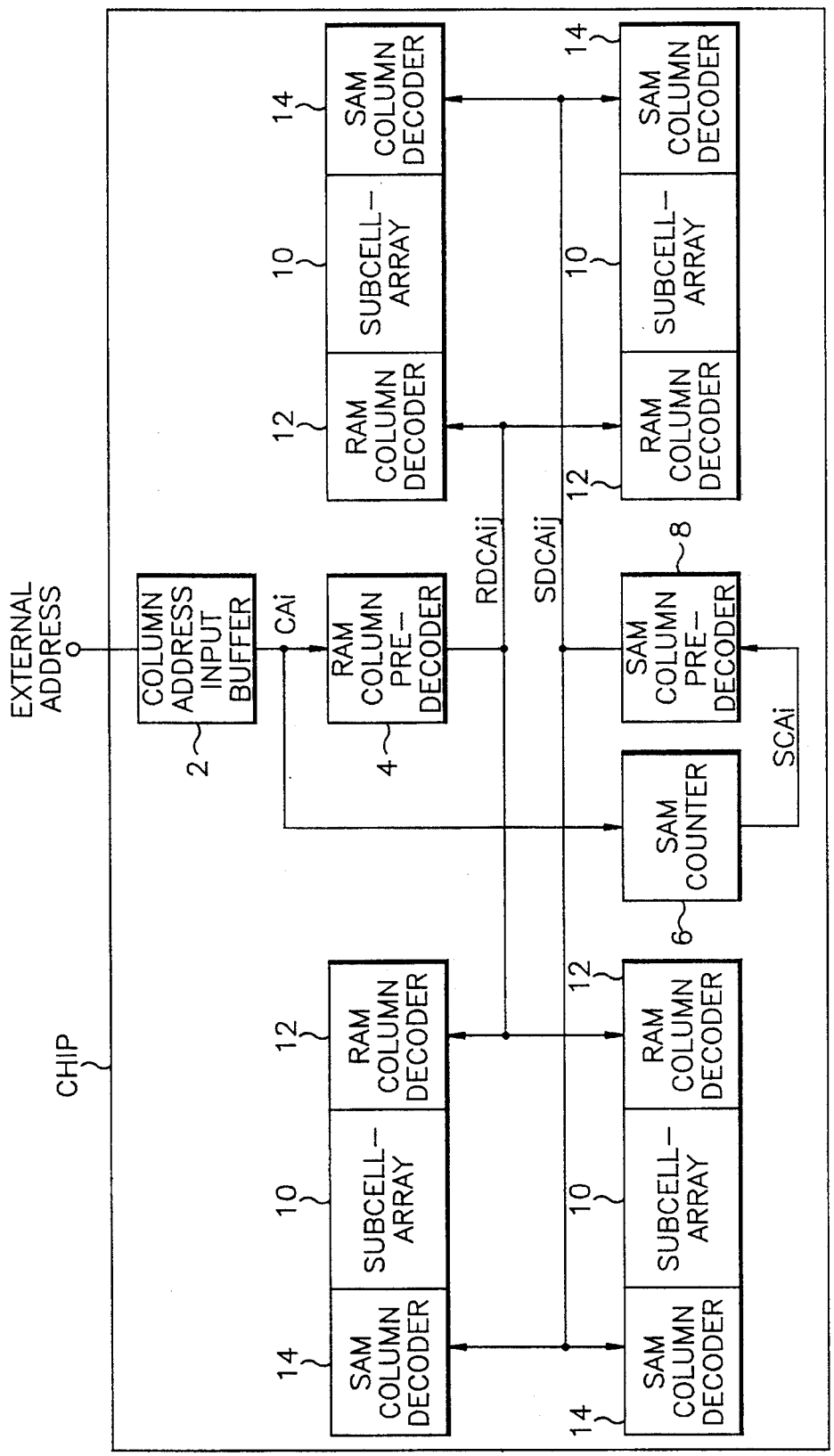
FIG. 1 illustrates a conventional arrangement of column decoders in a video RAM.
Figure 2:
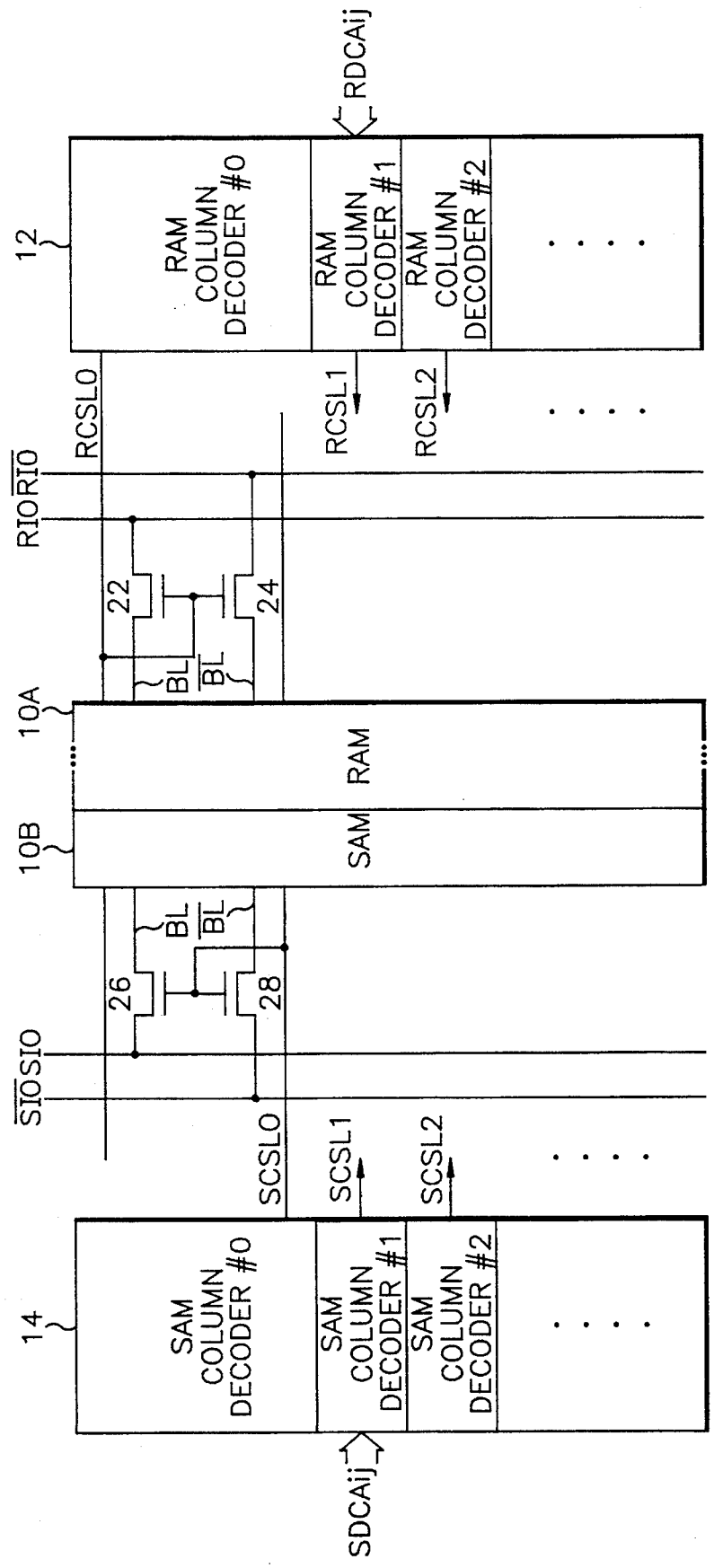
FIG. 2 shows the layout of RAM and SAM column decoders and their relationship to a memory subcell array.
Figure 3:
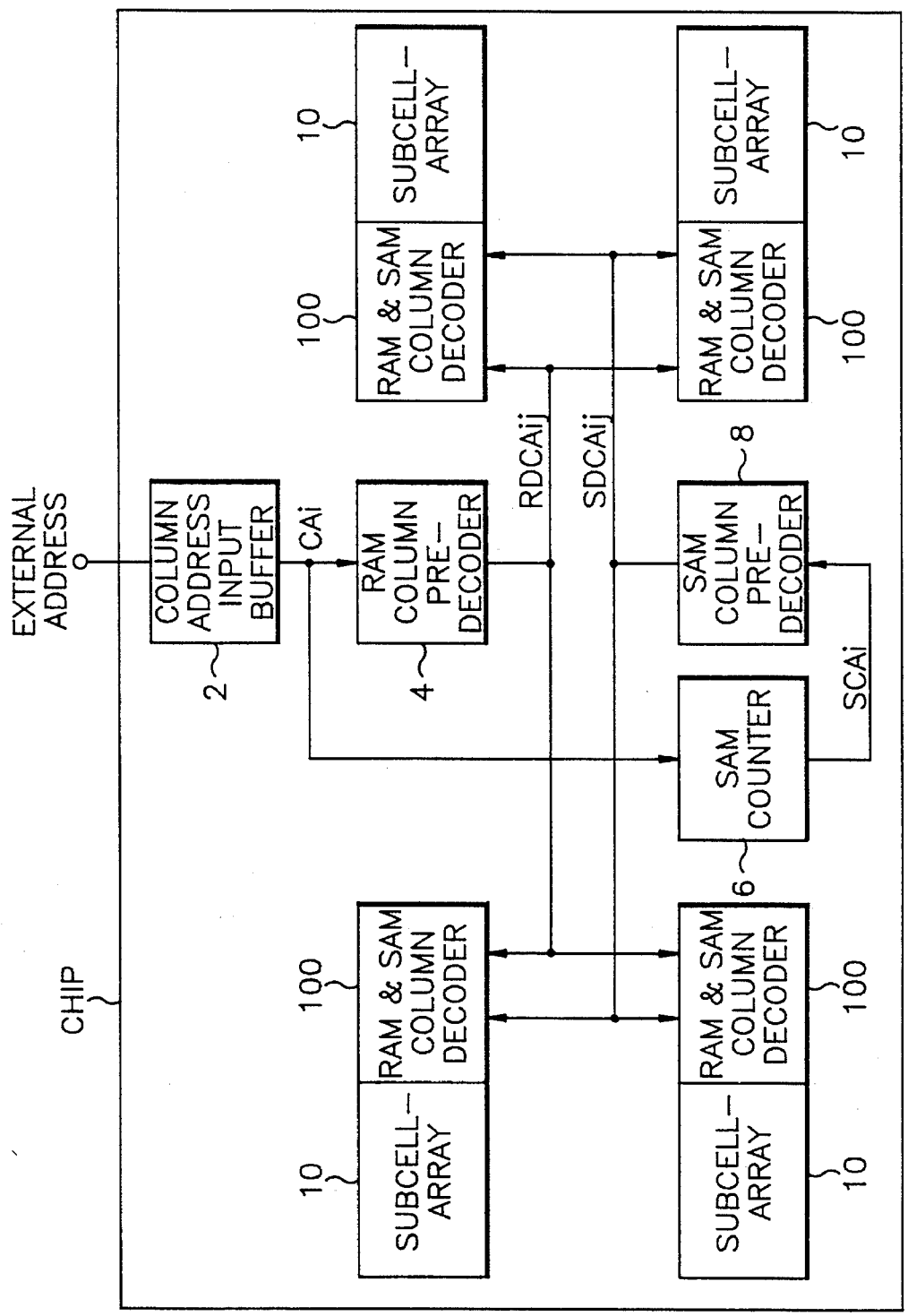
FIG. 3 illustrates a layout of column decoders in a video RAM according to the present invention.

A preferred embodiment of the present invention is illustrated in FIG. 3. In FIG. 3, a memory cell array comprises four respective sub-cell arrays 10. The sub-cell arrays 10 are arranged in a matrix, such that peripheral circuits, for example, column address input buffer 2, RAM column predecoder 4, SAM column predecoder 8, and SAM counter 6, may be arranged between the sub-cell arrays 10. Separate RAM and SAM column decoders 100, hereafter "column decoders, are respectively positioned on one side of a corresponding memory subcell array 10. Preferably, the column decoders 100 are positioned proximate the peripheral circuits, that is, between the sub-cell arrays 10 and the peripheral circuits. The RAM and SAM column decoders are positioned together. This arrangement minimizes the distance between each column decoder 100 and RAM column predecoder 4 and SAM column predecoder 8.

Figure 4A:
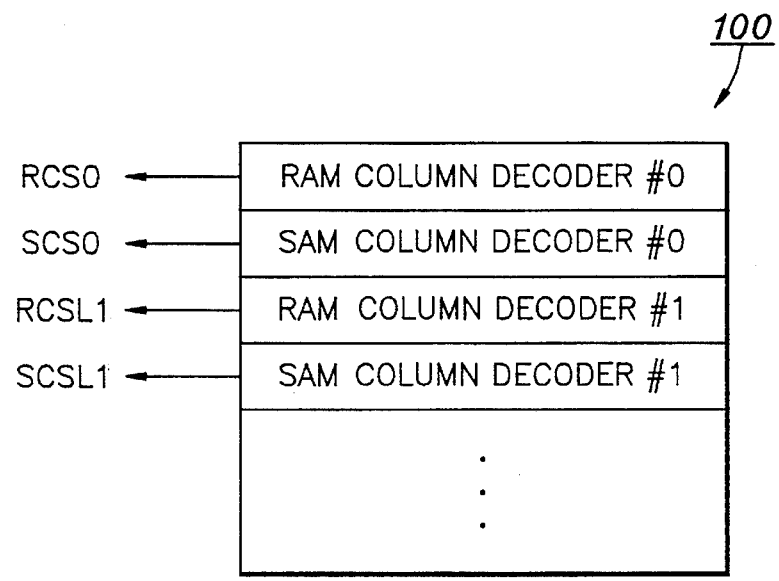
FIG. 4A further illustrates the layout of column decoders in a video RAM according to an embodiment of the present invention.
Figure 4B:
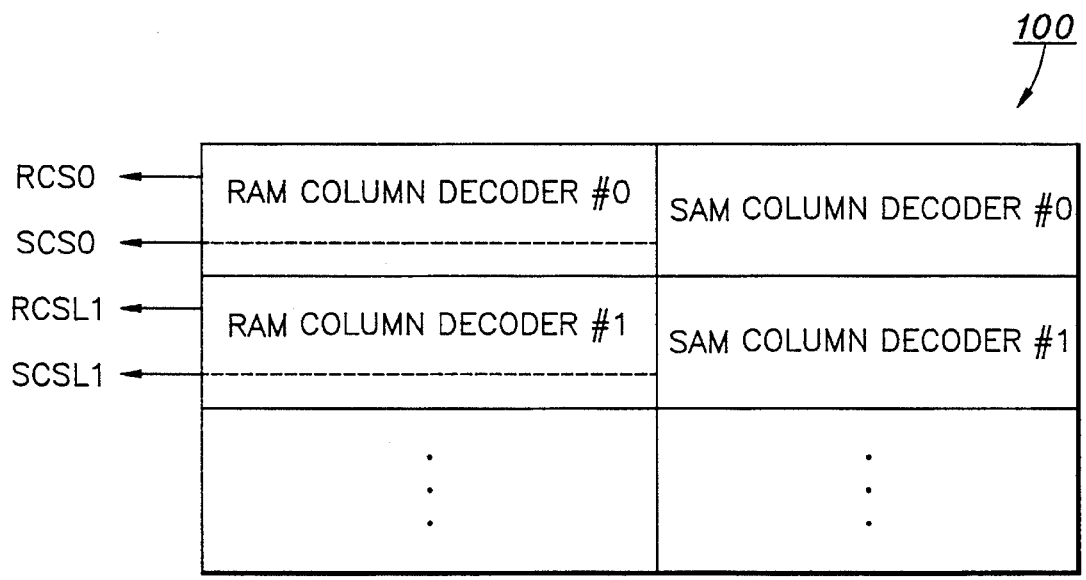
FIG. 4B further illustrates the layout of column decoders in a video RAM according to another embodiment of the present invention.

The arrangement of each column decoder is further illustrated in FIGS. 4A and 4B. As shown in FIG. 4A, a first embodiment of column decoder 100 according to the present invention comprises alternating RAM column decoder portions and SAM column decoder portions, i.e., RAM column decoder portion #0, SAM column decoder portion #0, RAM column decoder portion #1, SAM column decoder portion #1, etc. As shown in FIG. 4B, a second embodiment of column decoder 100 according to the present invention comprises RAM column decoder portions #0, #1, . . . #i positioned adjacent to SAM column decoder portions #0, #1, . . . #i. In each arrangement, respective RAM decoder column portions generate RAM column select signals, RCS0, RCS1, . . . RCSi, and respective SAM decoder column portions generate SAM column select signals, SCS0, SCS1, . . . SCSi. Assuming that each memory sub-cell array in FIG. 3 comprises 512 bit line pairs, the number of RAM column decoders is Preferably 256, and the number of SAM column decoders is Preferably 128.

The RAM and/or SAM column decoder portions may be alternatingly and adjacently grouped by twos, (for example, RAM #0 and RAM #1, next to SAM #0 and SAM #1, or RAM #0 and RAM #1 next to SAM #0), by fours, by eight or by any other grouping within the foregoing arrangements shown in FIGS. 4A and 4B. The arrangements may be modified such that the RAM and SAM column decoder portions are configured in "up" and "down" sections. Such a layout may be particularly advantageous in a cell array layout having a narrow pitch between bit lines.

Figure 5:
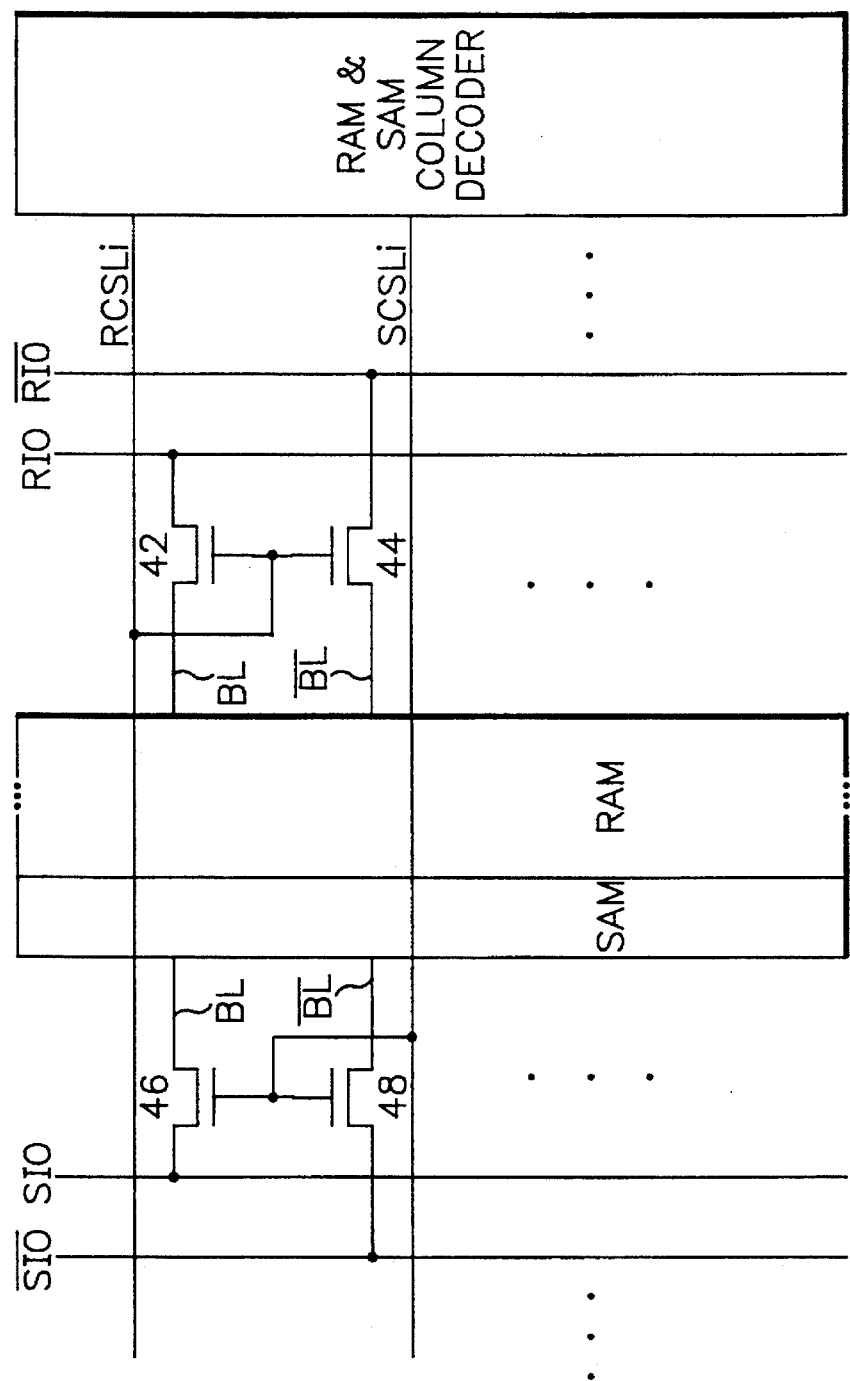
FIG. 5 illustrates the transfer of data to and from the memory subcell array via the RAM and SAM decoder of FIG. 3.

The relation of a column decoder 100 to a corresponding memory subcell array 10 is illustrated in FIG. 5. As in the conventional arrangement, memory sub-cell 10 comprises RAM cell array 10A and SAM cell array 10B respectively accessed by RAM input/output lines RIO and RIO(not) and SAM input/output lines SIO and SIO(not). Individual RAM column select signals (RCSi) and SAM column select signals (SCSi) are applied via signal lines from column decoder 100 indicated as RCSLi and SCSLi in FIG. 5. Each RAM column select line and SAM column select line are applied to sub-cell array 10 via respective transistor pairs, here illustrated by RAM transistor pair 42, 44, and by SAM transistor pair 46, 48, to control memory data access accomplished by RIO, $\overline{RIO}$, SIO, and $\overline{SIO}$.

Figure 6B:
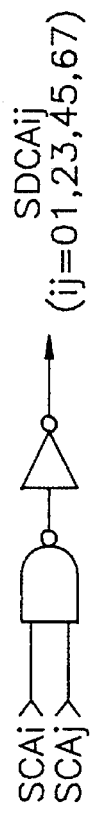
FIG. 6B is a detailed circuit diagram of a SAM column predecoder finding application in the present invention.
Figure 6A:
FIG. 6A is a detailed circuit diagram of a RAM column predecoder finding application in the present invention.
Figure 7B:
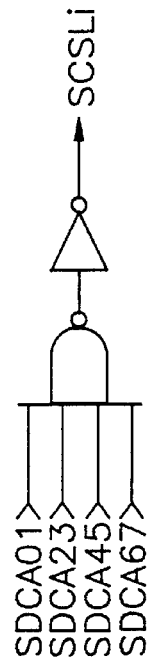
FIG. 7A is a detailed circuit diagram of a RAM column decoder finding application in the present invention; and, FIG. 7B is a detailed circuit diagram of a SAM column decoder finding application in the present invention.
Figure 7A:
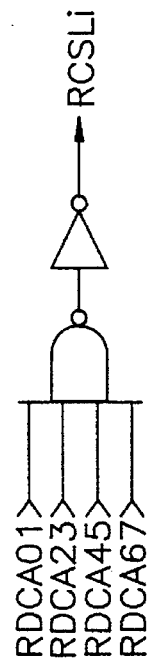

Examples of a RAM column predecoder 4 in FIG. 3 and a SAM predecoder 8 in FIG. 3 are shown in FIGS. 6A and 6B, respectively. Examples of a RAM column decoder portion and a SAM column decoder portion in FIGS. 4A and 4B are shown in FIGS. 7A and 7B, respectively.

The foregoing arrangements of RAM column decoder portions and SAM column decoder portions in FIGS. 4A and 4B allow the RAM column decoder and SAM column decoder sections of column decoder 100 to share a common power supply line, or a common set of power supply lines. Additionally, the position of the respective column decoders 100 between the peripheral circuits, and in particular the RAM predecoder and SAM predecoder circuits, allows shorter signals lines to be used between these circuits. Capacitive loading of the signal lines is thus minimized. In sum, the foregoing arrangement makes efficient use of available chip space, thereby facilitating increasingly dense integrations of the video RAM device.

The preferred embodiments are given by way of example, and as a means for explaining the use and making of the present invention. The embodiments are subject to routine modification by those of ordinary skill in the art. The present invention is not limited to the illustrative embodiments, but is defined by the appended claims.

What is claimed is:

1. A method of arranging column decoders in a video RAM, comprising the steps of:

dividing a memory cell array into a plurality of memory sub-cell arrays, each memory sub-cell array having a plurality of memory cells arranged in columns and rows;

arranging the plurality of memory sub-cell arrays around centrally located peripheral circuits including a predecoder; and, arranging a column decoder to one side of each memory sub-cell array between the memory sub-cell array and the peripheral circuits, each column decoder comprising a RAM column decoder section and a SAM column decoder section.

2. The method of claim 1, wherein each memory sub-cell array comprises:

a RAM memory cell array and, a SAM memory cell array, wherein data is transferred to and from the RAM memory cell array in response to RAM column select signals from the RAM column decoder section, and wherein data is transferred to and from the SAM memory cell array in response to SAM column select signals from the SAM column decoder section.

3. The method of claim 2, wherein each column decoder comprises alternating RAM column decoder portions of the RAM column decoder section, and SAM column decoder portions of the SAM column decoder section.

4. The method of claim 2, further comprising the step of:

locating the RAM column decoder section adjacent to the SAM column decoder section.

5. A method of arranging column decoders in a video RAM, comprising the steps of:

dividing a memory cell array into a plurality of memory sub-cell arrays, each memory sub-cell array having a plurality of memory cells arranged in columns and rows;

dividing each memory sub-cell array into a RAM memory cell array and a SAM memory cell array;

centrally disposing a RAM column predecoder and a SAM column predecoder between the plurality of memory sub-cell arrays;

arranging a corresponding column decoder to one side of each memory sub-cell array between the memory sub-cell array and the RAM column predecoder and SAM column predecoder, each column decoder comprising a RAM column decoder section and a SAM column decoder section.

6. The method of claim 5, wherein data is transferred to and from said RAM memory cell array in response to RAM column select signals from the RAM column decoder section and wherein data is transferred to and from the SAM memory cell array in response to SAM column select signals from the SAM column decoder section.

7. The method of claim 5, wherein each column decoder comprises alternating RAM column decoder portions of the RAM column decoder section, and SAM column decoder portions of the SAM column decoder section.

8. The method of claim 5, further comprising the step of:

locating the RAM column decoder section adjacent to the SAM column decoder section.

* * * * *